United States Patent [19]

Parent et al.

[11] Patent Number: 5,035,201
[45] Date of Patent: Jul. 30, 1991

[54] EVAPORATING BOAT HAVING PARALLEL INCLINED CAVITIES

[75] Inventors: Edward D. Parent, Hamilton, Mass.; Oliver S. Smith, Stratham, N.H.

[73] Assignee: GTE Products Corporation, Stamford, Conn.

[21] Appl. No.: 635,084

[22] Filed: Dec. 28, 1990

[51] Int. Cl.$^5$ .................... C23C 14/24; C23C 14/26
[52] U.S. Cl. .................................. 118/726; 392/388; 392/389
[58] Field of Search ................ 118/726; 392/388, 389

[56] References Cited

U.S. PATENT DOCUMENTS

| | | | |
|---|---|---|---|
| 3,466,424 | 9/1969 | Adams | 118/726 |
| 3,636,304 | 1/1972 | Passmore | 118/726 |
| 4,264,803 | 4/1981 | Shinko | 118/726 |
| 4,446,357 | 5/1984 | Barshter | 118/726 |

Primary Examiner—Richard Bueker
Attorney, Agent, or Firm—James Theodosopoulos

[57] ABSTRACT

A self-resistance-heated electrically-conductive refractory evaporating boat has inclined cavities on its two horizontal surfaces, the cavities being parallel to each other.

3 Claims, 1 Drawing Sheet

EVAPORATING BOAT HAVING PARALLEL INCLINED CAVITIES

This invention concerns self-resistance-heated, electrically-conductive refractory evaporating boats used in the vacuum deposition of metal, for example, aluminum. Examples thereof are shown in U.S. Pat. Nos. 4,847,031, 4,526,840, 4,373,952, 4,199,480, 4,089,643, 3,928,244, 3,915,900, 3,813,252, 3,803,707, 3,636,305, 3,636,304, 3,636,303, 3,582,611, 3,544,486, 3,256,103, 3,181,968, 2,984,807 and 2,962,538.

During evaporation of aluminum it is desirable to enhance the spreading of a molten aluminum film over the surface of the boat. If this is done by the use of a shim under one end of the boat, some electrical contact area is lost between the boat and the end clamps. If an inclined cavity is used, as shown in FIG. 2, uniform evaporation over the cavity area is lost because of the reduced cross section area of the boat at section A—A. Such reduced cross section area increases ohmic heating there and, consequently, increases the evaporation rate there.

This invention discloses an evaporating boat which overcomes the problems mentioned above. The boat has inclined cavities on both horizontal surfaces. The cavities are parallel to each other so that the cross sectional area between the contact ends of the boat is uniform.

In the drawing, FIG. 1 shows aluminum wire being fed into the cavity of an evaporating boat.

Figure 1:
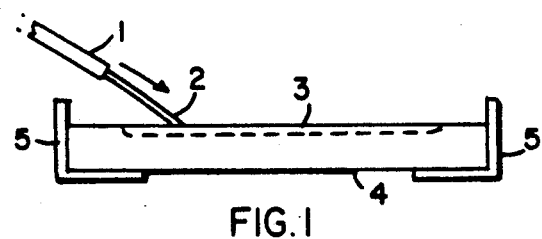

In FIG. 1, a wire feed 1 feeds aluminum wire 2 into the cavity 3 of an evaporating boat 4. Typically, aluminum wire 2 is fed into cavity 3 at about one-third the length of the cavity. Electrical power is provided to boat 4 by means of heavy copper end clamps 5.

Figure 2:
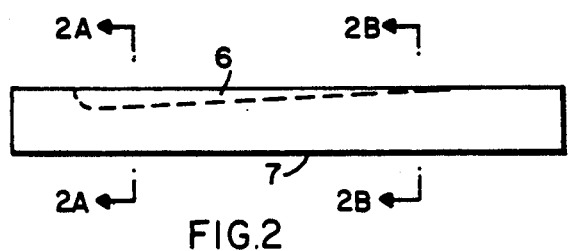
FIG. 2 shows a boat having an inclined cavity.
Figure 2A:
Figure 2B:

FIG. 2 shows a boat 7 having an inclined cavity 6. FIGS. 2a and 2b show how the cross section area of the boat differs at sections A—A and B—B. The reduced cross section at section A—A increases the ohmic resistance there and consequently provides a hot spot in the boat there.

Figure 3:
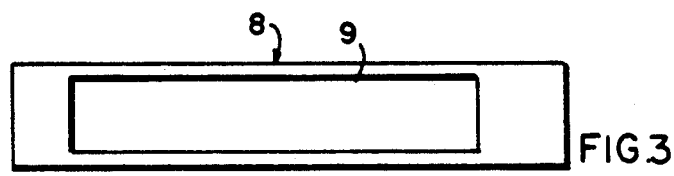
FIG. 3 is an elevational view and FIG. 4 a side view of a boat in accordance with this invention.
Figure 4:
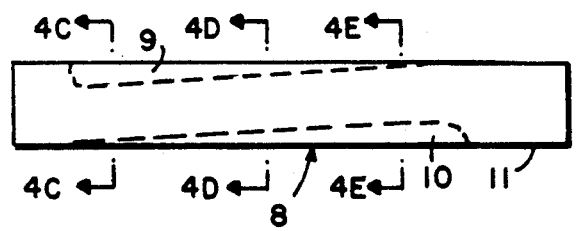
Figure 4C:
Figure 4D:
Figure 4E:

FIGS. 3 and 4 show one example of a boat 8 in accordance with this invention. Boat 8 has an inclined cavity 9 on the upper horizontal surface thereof and another inclined cavity 10 on the lower horizontal surface thereof. Cavities 9 and 10 are identical having the same shape and dimensions, and are parallel to each other. Consequently, the cross sectional area of boat 8 between contact ends 11 is constant, as shown in FIGS. 4a, 4b, 4c. In operation contact ends 11 are clamped in end clamps 5.

In one example, boat 8 was 152.4 mm long by 28.6 mm wide by 12.7 mm deep. Cavities 9 and 10 were 19 mm wide by 127 mm long and were inclined at a one degree slope. Inclined cavities within the scope of this invention can have a slope between one-half and five degrees.

Figure 5:
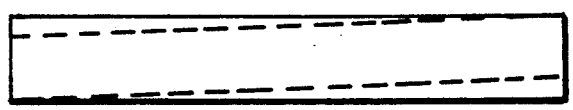
FIG. 5 and FIG. 6 show other examples of boats in accordance with this invention.
Figure 6:
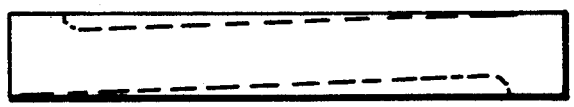

In the examples shown in FIGS. 5 and 6, the inclined cavities extend to one end of the boat.

We claim:

1. A self-resistance-heated electrically-conductive refractory evaporating boat having contact ends and having an upper horizontal surface and a lower horizontal surface, an inclined cavity in each horizontal surface, the cavities having the same shape and dimensions and being parallel to each other so that the cross sectional area of the boat between the contact ends is constant.

2. The boat of claim 1 wherein the slope of the inclined cavities is between one-half and five degrees.

3. The boat of claim 2 wherein each cavity extends to an end of the boat.

* * * * *